United States Patent
Sugiyama et al.

(10) Patent No.: US 6,369,438 B1
(45) Date of Patent: Apr. 9, 2002

(54) SEMICONDUCTOR DEVICE AND METHOD FOR MANUFACTURING THE SAME

(75) Inventors: Naoharu Sugiyama, Yokohama; Atsushi Kurobe, Yamato, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/468,923

(22) Filed: Dec. 22, 1999

(30) Foreign Application Priority Data

Dec. 24, 1998 (JP) .......................................... 10-367210

(51) Int. Cl.[7] ............................................ H01L 31/117
(52) U.S. Cl. ........................................ 257/616; 257/192
(58) Field of Search ............................... 257/263, 192, 257/459, 613–616; 117/20; 438/291, 933, 752

(56) References Cited

U.S. PATENT DOCUMENTS 5,223,919 A * 6/1993 Whight et al. ............... 257/459
5,461,243 A   10/1995 Ek et al.
5,714,777 A * 2/1998 Ismail et al. ................. 257/263
5,759,898 A * 6/1998 Ek et al. ...................... 438/291
6,077,343 A * 6/2000 Iida et al. ....................... 117/2

FOREIGN PATENT DOCUMENTS

JP          356121780 A  *  9/1981
JP          362210673 A  *  9/1987

OTHER PUBLICATIONS

Hacke, M. et al., "MBE Growth and Characterization of Buried Silicon Oxide Films on Si (100)", Thin Solid Films, vol. 280, p. 107–111, (1996).

* cited by examiner

Primary Examiner—Nathan Flynn
Assistant Examiner—Leonardo Andujar
(74) Attorney, Agent, or Firm—Finnegan, Henderson, Farabow, Garrett & Dunner, L.L.P.

(57) ABSTRACT

A method of manufacturing a semiconductor device comprising the steps of forming a first crystal silicon layer doped with oxygen on a single crystal silicon substrate, forming a crystal silicon-germanium layer on the first crystal silicon layer, forming a second crystal silicon layer on the crystal silicon-germanium layer, and imparting strain to the second crystal silicon layer by a thermal treatment.

12 Claims, 3 Drawing Sheets

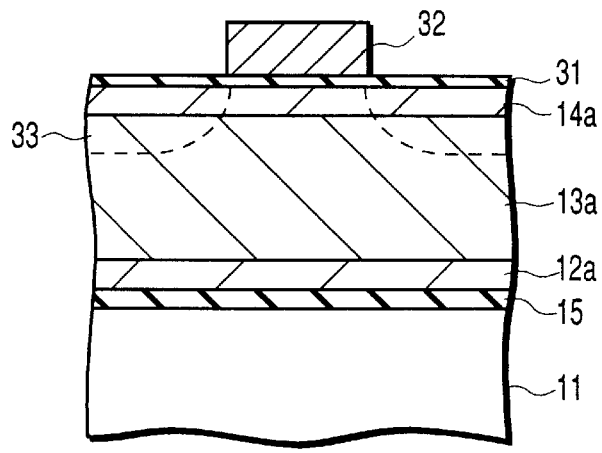
FIG. 5
| OXYGEN CONCENTRATION | 2% | 5% | 10% | 15% |
|---|---|---|---|---|
| THICKNESS | 40nm | 20nm | 10nm | 5nm |
FIG. 6
FIG. 7A
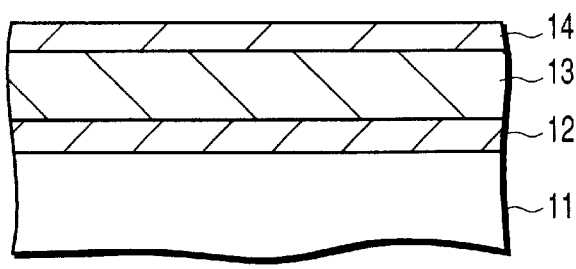
FIG. 7B

SEMICONDUCTOR DEVICE AND METHOD FOR MANUFACTURING THE SAME

BACKGROUND OF THE INVENTION

The present invention relates to a semiconductor device and a method for manufacturing the same.

One of efficient means for improving performance of semiconductor devices is to enhance a mobility of electrons. In usually-used single crystal silicon, an upper limit of the electron mobility is fixed at a predetermined value. However, it has been reported that the mobility of electrons is enhanced in the crystal silicon having strain in comparison with the normal (strain-free) silicon crystal.

For example, U.S. Pat. No. 5,461,243 discloses a technique for forming a relaxed SiGe layer and a Si layer having strain on a SOI substrate.

However, the aforementioned technique requires an expensive SOI substrate, so that the manufacturing cost inevitably increases.

BRIEF SUMMARY OF THE INVENTION

An object of the present invention is to provide a semiconductor device and a method of manufacturing the same, capable of using a usually-employed silicon substrate and obtaining a crystal silicon layer having strain (a crystal silicon layer being strained) in a good quality.

A method of manufacturing a semiconductor device according to the first aspect of the present invention comprises the steps of:

forming a first crystal silicon layer doped with oxygen on a single crystal silicon substrate; and forming a crystal silicon-germanium layer (single crystal is preferable) on the first crystal silicon layer.

It is preferable that the method of manufacturing a semiconductor device further comprise steps of forming a second crystal silicon layer (single crystal is preferable) on the crystal silicon-germanium layer; and imparting strain to the second crystal silicon layer by a thermal treatment.

Before the heat treatment is performed, the first crystal silicon layer, the crystal silicon-germanium layer, and the second crystal silicon layer substantially follow lattice information of the underlying single crystal silicon substrate, so that the crystal silicon-germanium layer has strain. When a thermal treatment is applied to such a structure, oxygen contained in the first crystal silicon layer is condensed to form a silicon oxide layer between the silicon substrate and the crystal silicon-germanium layer. As a result, the strain of the crystal silicon-germanium layer is relaxed, in other words, comes to a lattice-relaxed state. Simultaneously, the second crystal silicon layer is formed in a crystalline state having strain.

By virtue of such a function, it is possible to obtain not only the single crystal silicon-germanium layer sufficiently relaxed but also a good single crystal silicon layer having strain, even if the single crystal silicon-germanium layer is thin in film thickness.

A concentration of oxygen contained in the first crystal silicon layer is preferably 1% or more in terms of atomic composition ratio. It is preferable that the uppermost limit of the oxygen concentration be set at a value enough to maintain characteristics as a semiconductor. When the oxygen concentration is higher than 20%, the crystallinity of the first crystal silicon layer is maintained. However, roughness of the surface of the first crystal silicon layer becomes outstanding, degrading a flatness of the surface of the first crystal silicon layer. Therefore, the oxygen concentration of the first crystal silicon layer is preferably set at 20% or less. To improve the flatness, the concentration of oxygen contained in the first crystal silicon layer is preferably set at 15% or less, more preferably 12% or less.

A semiconductor device according to a second aspect of the present invention comprises:

a first crystal silicon layer doped with oxygen and formed on the a single crystal silicon substrate;

a crystal silicon-germanium layer (single crystal is preferable) formed on the first crystal silicon layer; and a second crystal silicon layer (single crystal is preferable) having strain and formed on the crystal silicon-germanium layer.

A semiconductor device according to a third aspect of the present invention comprises:

a first crystal silicon layer formed on a single crystal silicon substrate, the first crystal silicon layer having a structure in which first crystal silicon regions doped with oxygen sandwich a second crystal silicon region doped with an n-type or p-type impurity;

a crystal silicon-germanium layer (single crystal is preferable) formed on the first crystal silicon layer; and a second crystal silicon layer (single crystal is preferable) having strain and formed on the crystal silicon-germanium layer.

In the inventions according to the second and third aspects, the crystal silicon-germanium layer is formed on the first crystal silicon layer doped with oxygen, so that dislocation for relaxing the strain of the crystal silicon-germanium layer can be absorbed by the first crystal silicon layer. Therefore, even if the film thickness of the crystal silicon-germanium layer is thin to some extent, it is possible to suppress the dislocation from reaching the crystal silicon-germanium layer. Therefore, it is possible to obtain a crystal silicon-germanium layer sufficiently relaxed and a crystal silicon layer having strain in a good quality.

In addition, since the band gap of the first crystal silicon layer doped with oxygen is wide, it is possible to reduce the capacitance of an element in the same way as in the SOI structure.

Furthermore, in the invention of the third aspect, a potential of the underlying portion can be fixed by the second crystal silicon region doped with an impurity, it is therefore possible to prevent a short-channel effect, efficiently.

As to the oxygen concentration (atomic composition ratio) contained in the first crystal silicon layer, the same limitation as in the first-aspect invention is employed.

A semiconductor device according to the fourth invention comprises a first crystal silicon layer doped with oxygen and formed on the a single crystal silicon substrate;

a laminated silicon layer formed on the first crystal silicon layer, the laminated silicon layer having a structure in which first crystal silicon regions containing oxygen and second crystal silicon regions undoped with oxygen are alternately stacked;

a crystal silicon-germanium layer (single crystal is preferable) formed on the laminated silicon layer; and a second crystal silicon layer (single crystal is preferable) having strain and formed on the crystal silicon-germanium layer.

In the fourth invention, an n-type or p-type impurity may be doped in at least one of the second crystal silicon regions.

In the fourth invention, germanium may be doped in at least one of the second crystal silicon regions.

In the fourth invention, the crystal silicon-germanium layer is formed on the laminated silicon layer, so that it is possible to absorb dislocation for relaxing strain of the crystal silicon-germanium layer by the laminated silicon layer having a super lattice structure. Therefore, even if the film thickness of the crystal silicon-germanium layer is thin to some extent, it is possible to suppress the dislocation from reaching the crystal silicon-germanium layer. Therefore, it is possible to obtain a crystal silicon-germanium layer sufficiently relaxed and a crystal silicon layer having strain in a good quality.

Furthermore, when the n-type or p-type impurity is doped in the second crystal silicon region, a potential of the underlying portion can be fixed by the second crystal silicon region. It is therefore possible to prevent a short-channel effect, efficiently.

As to the oxygen concentration (atomic composition ratio) contained in the first crystal silicon layer, the same limitation as in the first-aspect invention is employed.

The present invention provides methods A and B for manufacturing a semiconductor device as described below.

The manufacturing method A comprises the steps of forming a crystal silicon-germanium layer above a single crystal silicon substrate; and performing a thermal treatment in an oxidizing atmosphere, thereby forming a first silicon oxide layer being formed between the single crystal silicon substrate and the crystal silicon-germanium layer and a second silicon oxide layer on the crystal silicon-germanium layer, and reducing the thickness of the crystal silicon-germanium layer and increasing the germanium concentration of the crystal silicon-germanium layer.

When the thermal treatment is performed in the oxidizing atmosphere in the method A, a silicon oxide layer or a silicon layer doped with oxygen is preferably formed between the single crystal silicon substrate and the crystal silicon-germanium layer.

When the thermal treatment is performed in the oxidizing atmosphere, the first and second silicon oxide layers are formed (when the silicon oxide layer is already present before the thermal treatment is performed, the first and second silicon oxide layers are increased in thickness). The reason why the silicon oxide layer is formed not only on the crystal silicon-germanium layer but also between the single crystal silicon substrate and the crystal silicon-germanium layer is that oxygen is transported through the crystal silicon-germanium layer by the thermal treatment performed in the oxidizing atmosphere.

Since the first and second silicon oxide layers are formed, the film thickness of the crystal silicon-germanium layer is reduced. Germanium is rarely present in the first and second silicon oxide layers, is and the first and second silicon oxide layers function as a barrier for suppressing diffusion of germanium. For these reasons, the germanium concentration of the crystal silicon-germanium layer sandwiched by the first and second silicon oxide layers, increases. As a result, it is possible to form a high-quality crystal silicon-germanium layer reduced in thickness and high in germanium concentration, on the silicon oxide layer.

The method B comprises the steps of forming a crystal silicon-germanium layer on a single crystal silicon substrate; and performing a thermal treatment in an oxidizing atmosphere, thereby forming a first silicon oxide layer in the crystal silicon-germanium layer and simultaneously forming a second silicon oxide layer on the crystal silicon-germanium layer, and increasing a germanium concentration of the crystal silicon-germanium layer between the first silicon oxide layer and the second silicon oxide layer.

When the thermal treatment is performed in the oxidizing atmosphere in the manufacturing method B, it is preferable that the silicon oxide layer or the silicon layer doped with oxygen be formed in the crystal silicon-germanium layer.

In the manufacturing method B, it is possible to form a high-quality crystal silicon-germanium layer reduced in thickness and high in germanium concentration, on the silicon oxide layer, in the same manner as in the manufacturing method A.

The methods A and B further comprises the steps of exposing the surface of the crystal silicon-germanium layer by removing the second silicon oxide layer; and forming a crystal silicon layer having strain on the exposed crystal silicon-germanium layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a schematic sectional view showing a structure of the semiconductor device according to Embodiment 3 of the present invention;

FIG. 6 is a table showing the relationship between oxygen concentration and thickness of an oxygen-containing Si layer;

FIGS. 7A to 7D are schematic sectional views of a semiconductor device formed by a manufacturing method according to Embodiment 4 of the present invention;

DETAILED DESCRIPTION OF THE INVENTION

Now, embodiments of the present invention will be explained with reference to the accompanying drawings.

EMBODIMENT 1

First, Embodiment 1 will be explained with reference to FIGS. 1A to 1C.

Figure 1A:
FIGS. 1A to 1C are schematic sectional views of a semiconductor device according to Embodiment 1 of the present invention, for showing steps of its manufacturing method.
Figure 1B:
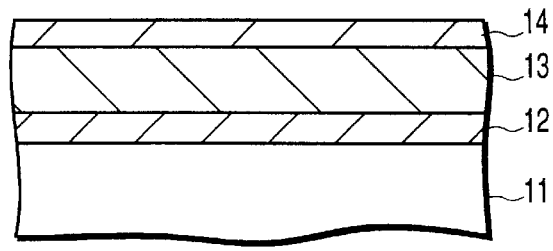
Figure 1C:
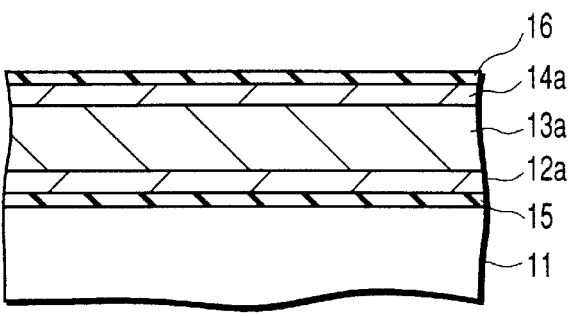

A crystal silicon layer 12 containing 2% oxygen is deposited on a single crystal silicon substrate 11 having a crystalline surface of a (100) orientation (FIG. 1A).

The oxygen-containing crystal silicon layer 12 is formed by an ultrahigh vacuum CVD apparatus formed of an ultrahigh vacuum container having an ultimate degree of vacuum, $10^{-8}$ Pa. The structure of the CVD apparatus is disclosed more specifically in Jpn. Pat. Appln. Publication No. 7-245236. Therefore, the structure of the CVD apparatus will be schematically explained below.

A graphite heater for heating the silicon substrate held in a vacuum is set at a rear surface side thereof. Therefore, it is possible to increase the temperature of the silicon substrate to 1000° C. by the heater. An auxiliary heater is set at an upper surface side of the substrate for thermally decomposing a gaseous molecular material. By the presence of the auxiliary heater, a decomposed material can be supplied to the substrate even if a substrate temperature is too low to decompose the material in the upper surface of the substrate. Hence, it is possible to accelerate film growth at a low temperature.

More specifically, the film was actually formed by the aforementioned apparatus by setting a substrate temperature at 600° C., using a disilane ($Si_2H_6$) gas as a raw material for a silicon thin film, and setting the partial pressure of the raw material at 20 mPa. Furthermore, to form the silicon thin film doped with oxygen, helium gas containing oxygen gas (1%) was introduced into a film formation atmosphere. The partial pressure of the helium gas used herein was presumably 10 mPa and the partial pressure of oxygen was presumably 0.1 mPa. Furthermore, an exterior heater on the upper surface side of the substrate was raised in temperature to 1800° C. The film formation was performed under the aforementioned conditions for 50 minutes to thereby form the oxygen-containing silicon crystalline layer 12 which contains oxygen atoms in an amount of 2% in the silicon crystal, in a thickness of 40 nm. The oxygen-containing silicon crystalline layer 12 was formed in a good-quality single crystalline structure sufficient to follow the lattice information of the underlying single crystal silicon substrate 11.

After the formation of the oxygen-containing crystal silicon layer 12 was completed, the supply of an oxygen/helium gas mixture was terminated. Furthermore, temperature of the exterior heater was reduced and germane gas ($GeH_4$) was newly introduced to grow a crystal SiGe layer. The crystal SiGe layer was formed by setting a substrate temperature at 600° C., a partial pressure of disilane at 20 mPa, and a partial pressure for germane at 45 mPa. The film formation was performed for 7 minutes to thereby obtain the crystal SiGe layer 13 (100 nm thick) having Germane 20% in terms of composition ratio. The crystal SiGe layer 13 thus obtained had strain. After the film formation of the crystal SiGe layer 13 was completed, the supply of the germane gas was terminated. Subsequently, the crystal silicon layer was allowed to grow at a substrate temperature of 600° C. and a disilane gas partial pressure of 8 mPa, with the result that a crystal silicon layer 14 was obtained in a thickness of 20 nm (FIG. 1B).

In the method employed in this embodiment, the disilane gas is partially decomposed by use of the exterior heater, and then, the decomposed disilane gas is supplied to the upper surface of the substrate. When the oxygen-containing silicon layer is formed by decomposing the raw material at the surface of the substrate without using the exterior heater, a film formation speed of the oxygen-containing silicon layer decreases to 0.1 nm/minute. This is presumably because the substrate surface is covered with oxygen atoms and inactivated by them, with the result that the decomposition of disilane molecules is inhibited. In this case, the film formation speed can be increased if the partial pressure of the disilane gas is increased. However, if the disilane gas is supplied in a large amount while the substrate temperature is maintained low, the formed film tends to be obtained in an amorphous state or a polycrystalline state. In the present invention, it is important that the SiGe layer 13 and the Si layer 14 formed on the oxygen-containing silicon layer 12 have a single crystalline structure having the same lattice information as that of the underlying single crystal substrate.

As a method of decomposing the raw material gas other than on the substrate surface, a plasma CVD method is also useful. In this case, as is the same as mentioned above, it is important not to form a layer in an amorphous state or in a polycrystalline state.

In accordance with the aforementioned method, the oxygen-containing crystal Si layer 12, a crystal SiGe layer 13, and crystal Si layer 14 (Si cap layer) are sequentially formed without exposing them to air. In this step, the lattice of the crystal SiGe layer 13 is matched with that of the underlying crystal Si layer 12 and thus has a stain therein.

The laminated substrate thus formed is subjected to thermal oxidation performed in an oxidation furnace. Any thermal oxidation method is used as long as it is usually employed in manufacturing steps for semiconductor devices. In this embodiment, the thermal oxidation was actually performed at 950° C. for 30 minutes in a water vapor-introduced oxidation atmosphere. By virtue of this step, oxygen atoms in the oxygen-containing crystal Si layer 12 are condensed to form an amorphous silicon oxide layer formed of $SiO_2$ and SiO. As a result, a laminated structure constituting of an amorphous $SiO_x$ layer 15 (3 nm thick), a crystal Si layer 12a containing a small amount of oxygen (16 nm), a crystal SiGe layer 13a (100 nm), a crystal Si layer 14a (10 nm), and a $SiO_2$ layer 16 (20 nm), is formed on the Si substrate 11 (FIG. 1C).

Due to the thermal treatment thus performed, the crystal SiGe layer 13a is relaxed and the lattice constant of the crystal SiGe layer 13a comes closer to the lattice constant of the normal SiGe(non-relaxed state). On the other hand, lattice strain is imparted to the crystal Si layer 12a containing a small amount of oxygen and the crystal Si layer 14a at a surface side. Note that, after the thermal treatment, Ge is diffused from the crystal SiGe layer to the crystal Si layer, so that the Si layer contains Ge in an amount of 1% to several %.

In the case where the degree of relaxation of the SiGe layer 13a (a ratio of lattice constant in the vertical direction to the horizontal direction of the SiGe layer relaxed by the thermal treatment step) is not sufficient, a thermal treatment is further applied to the SiGe layer. At this time, it is effective if the thermal treatment is performed in an inert gas atmosphere containing a small amount of oxidizing gas. To describe more specifically, if the heating temperature is increased to about 1200° C. in a nitrogen gas or argon gas atmosphere containing oxygen gas in an amount of about 0.2 to 0.8%, it is possible to obtain the SiGe layer sufficiently relaxed. Alternatively, if the thermal treatment is performed at 1000° C. or more in an inert gas atmosphere containing a small amount of oxygen without performing the thermal oxidation step, it is possible to partially relax the SiGe layer.

In the aforementioned heating treatment, it is necessary to set the upper limit of the heating temperature at a melting point of Si (about 1450° C.) or less. In the case of SiGe, the upper limit of the heating temperature is set at a further lower temperature (the temperature range will be more specifically described later in Embodiment 4).

The reason why the thermal treatment is performed in the inert gas atmosphere containing the oxidizing gas in a small amount, is to maintain the flatness of the surface by allowing the oxide film to slightly remain on the crystal Si surface.

The degree of lattice relaxation of the SiGe layer 13a varies depending upon the ratio of the Si layer 14a to the SiGe layer 13a in thickness. When the SiGe layer is sandwiched by thin Si layers, it is difficult to obtain the SiGe layer completely (100%) relaxed. However, in the case where the thermal treatment is performed at a temperature higher than 1050° C. for time period longer than one hour, Ge of the SiGe layer is diffused into the Si layer. Therefore, when the Si layer is thin, the Si layer is not substantially present, with the result that a uniform SiGe layer is obtained.

In this embodiment, the oxygen-containing Si layer is formed in a thickness of 40 nm and in an oxygen concentration of 2%. However, it is possible to arbitrarily set the thickness and concentration of the oxygen-containing Si layer by appropriately changing film formation conditions including a substrate temperature and a partial pressure of the raw material gas. When the oxygen concentration is increased, the Si layer grown on the oxygen-containing Si layer deteriorates in crystallinity. However, this problem can be avoided by reducing the thickness of the oxygen-containing Si layer.

When the oxygen concentration is high, even if the oxygen-containing Si layer is thin, it is possible to obtain a layer sufficiently serving as an $SiO_x$ layer after annealing. The relationship between the oxygen concentration and the thickness of the oxygen-containing Si layer usable in practice, is shown in FIG. 6. As shown in FIG. 6, the higher the oxygen concentration, the thinner the thickness of the oxygen-containing Si layer. However, in the case where the oxygen concentration is higher than 20%, the crystallinity is maintained. However, the surface of the crystal silicon layer becomes uneven, degrading flatness. Even in the case where the SiGe layer or the Si layer containing no oxygen is grown on the oxygen-containing Si layer, the flatness of the surface is not improved. Therefore, it is preferable that the oxygen concentration of the crystal silicon layer be 20% or less. Furthermore, to improve the flatness, the oxygen concentration is preferably set at 15% or less, and more preferably 12% or less, and the lowermost limit is set at 1% or more.

If the oxygen-containing Si layer is formed as thin as possible and a layer having oxygen atoms in an amount of about $1.5 \times 10^{15}$ $cm^{-2}$ among the crystal Si layers, is substantially formed, it is possible to relax the crystal SiGe layer and impart strain to the uppermost crystal Si layer.

EMBODIMENT 2

Now, Embodiment 2 of the present invention will be explained with reference to FIGS. 2–4.

Figure 2:
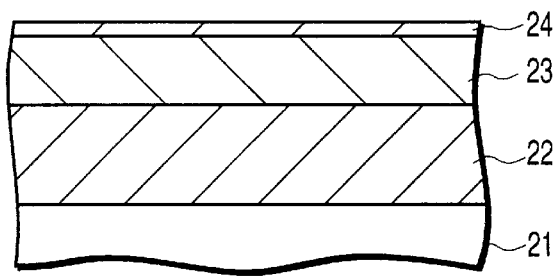
FIG. 2 is a schematic sectional view of a structure of a semiconductor device according to Embodiment 2 of the present invention.

In the example shown in FIG. 2, a crystal silicon layer 22 (1 $\mu$m thick) containing oxygen (1%) is first formed on a single crystal silicon substrate 21. Then, a crystal SiGe layer 23 (500 nm thick) containing Ge in a composition ratio of 20% is formed thereon. Furthermore, a crystal silicon layer 24 (20 nm thick) having strain is formed. The laminated structure can be formed in the same manner as in the steps before the thermal treatment step of Embodiment 1. Since the SiGe layer 23 is thicker than in Embodiment 1, strain can be imparted to the silicon layer 24.

In the laminated structure shown in FIG. 2, the oxygen-containing silicon layer 22 can absorb energy generated by relaxing the crystal SiGe layer 23. Therefore, it is possible to obtain a good-quality silicon layer 24 having strain. In this embodiment, unlike Embodiment 1, oxygen condensation does not take place and the silicon oxide layer is not formed in the oxygen-containing silicon layer 22 by high-temperature thermal treatment. The oxygen-containing silicon layer 22 has a forbidden band whose width is wider than that of the normal crystal silicon layer. Therefore, this embodiment is advantageous since a capacitance of an element can be reduced in the same manner as in the case where the element is formed on a semiconductor layer on an insulating layer.

Figure 3:
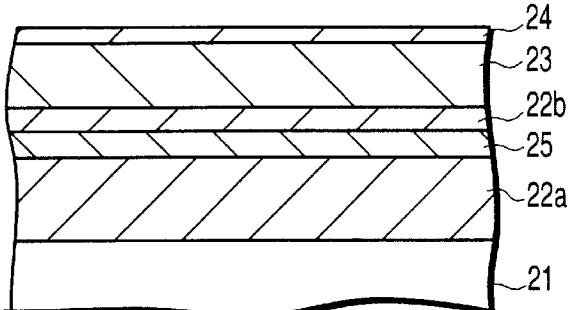
FIG. 3 is a schematic sectional view of another structure of the semiconductor device according to Embodiment 2 of the present invention.

In the example shown in FIG. 3, a layer doped with arsenic (As) is further added to the structure shown in FIG. 2. More specifically, on the single crystal silicon substrate are sequentially formed a crystal silicon layer 22a (2 $\mu$m thick) containing 1% oxygen, a crystal silicon layer 25 doped with arsenic (As) in an amount of $5 \times 10^{20}$ $cm^{-3}$ (100 nm thick, no oxygen added), a crystal silicon layer 22b (100 nm thick) containing 1% oxygen, a crystal SiGe layer 23 containing Ge (500 nm thick) in a composition ratio of 20%, and a crystal silicon layer 24 having strain (20 nm thick).

When this structure is employed, an electrode can be connected to the As-doped layer. It is therefore possible to fix the potential at a substrate side through the electrode, so that the potential of the channel layer of a field effect transistor can be stabilized.

Figure 4:
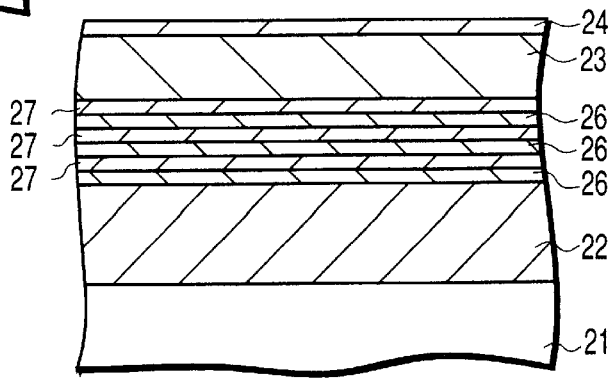
FIG. 4 is a schematic sectional view of still another structure of the semiconductor device according to Embodiment 2 of the present invention.

In the example shown in FIG. 4, a super lattice structure is further added to the structure shown in FIG. 2. The super lattice structure is formed of the silicon layer doped with arsenic (oxygen undoped crystal silicon layer) and a silicon layer containing oxygen.

More specifically, the crystal silicon layer 22 (2 $\mu$m thick) containing 1% oxygen is formed on the single crystal silicon substrate 21. Subsequently, a plurality of crystal silicon layers 26 (20 nm thick) doped with arsenic (As) in an amount of $5 \times 10^{20}$ $cm^{-3}$ and a plurality of crystal silicon layers 27 (20 nm thick) containing 1% oxygen are formed to obtain a super lattice structure. Furthermore, on the super lattice structure are sequentially formed the crystal SiGe layer 23 (500 nm thick) containing Ge in a composition ratio of 20% and the crystal silicon layer 24 (20 nm thick) having strain.

In such a structure, if an electrode is connected to the As-doped layer, it is possible to fix the potential at a substrate side through the electrode. It is therefore possible to stabilize the potential of the channel layer of the field effect transistor.

In the example shown in FIG. 4, all of the oxygen-free layers 26 constituting the super lattice structure are doped with arsenic. However, only the uppermost oxygen-free layer may be doped with arsenic whereas the other layers are allowed to be arsenic-free.

In the example shown in FIG. 4, a crystal SiGe layer may be formed in place of the oxygen-free layer 26 constituting the super lattice structure. In this case, it is possible to generate dislocation by the super lattice structure consisting of the crystal SiGe layer and the oxygen-doped crystal silicon layer. Further, in this embodiment, since the dislocation can be stopped within the super lattice structure without reaching the SiGe layer 23 formed on the super lattice structure, it is possible to obtain a good-quality silicon layer having strain.

Note that the crystal SiGe layer and the oxygen-containing crystal silicon layer constituting the super lattice structure may be increased in number and the Ge composition ratio of the SiGe layer may be gradually increased toward the upper SiGe layer from the lower SiGe layer. Due to this structure, it is possible to suppress the dislocation from transmitting to the upper SiGe layer. As a result, a silicon layer having strain can be obtained in a good quality. In this case, arsenic may be doped only in the uppermost SiGe layer of the super lattice structure.

EMBODIMENT 3

Embodiment 3 of the present invention will be explained with reference to FIG. 5. This embodiment shows an example of a field effect transistor formed by using the structure shown in Embodiment 1 or 2.

More specifically, the embodiment shown in FIG. 5 shows a field effect transistor formed on the laminated substrate formed by the method shown in Embodiment 1. The field effect transistor may be formed by a conventionally used technique. To be more specific, the field effect transistor is formed by depositing a polycrystalline silicon layer 32 on the silicon oxide film serving as the gate insulating film 31 and patterning the polycrystalline silicon layer 32 into a gate electrode and then forming a source/drain region 33.

In the structure shown in FIG. 5, the Si layer 14a having strain is used as a channel layer. It is therefore possible to enhance a carrier mobility (particularly, electron mobility). Furthermore, the silicon substrate 11 and the element formation region are isolated from each other by the oxygen-containing silicon layer 15 substantially serving as a dielectric. Therefore, it is possible to reduce a capacitance of the source/drain region and thus realize the field effect transistor operating at a high-speed.

EMBODIMENT 4

Embodiment 4 of the present invention will be explained with reference to FIGS. 7A–7D.

First, a crystal Si layer 12 containing oxygen (7%) is deposited on a single crystal silicon substrate 11 having a crystal surface of a (100) orientation.

The oxygen-containing crystal silicon layer 12 is formed by an ultrahigh vacuum CVD apparatus in the same manner as described in Embodiment 1 (FIG. 7A).

More specifically, the layer 12 was formed using the ultrahigh vacuum CVD apparatus by setting a substrate temperature at 600° C., using disilane ($Si_2H_6$) gas as a raw material for the silicon film at a partial pressure of 20 mPa. To form the silicon thin film doped with oxygen, helium gas containing oxygen gas (2%) was introduced into a film formation atmosphere. The partial pressure of helium used herein was presumably 10 mPa and the partial pressure of oxygen was presumably 0.2 mPa. Furthermore, an exterior heater set at a substrate surface side was heated to 1800° C. Under these conditions, the film formation was performed for 40 minutes to obtain the oxygen-containing crystal silicon layer 12 (15 nm-thick) containing oxygen atoms in an amount of 7% in the silicon crystal. The oxygen-containing crystal silicon layer 12 is formed in a good single crystalline structure sufficient to follow lattice information of the underlying single crystal silicon substrate 11.

After the formation of the oxygen-containing crystal silicon layer 12 was completed, the supply of an oxygen/helium gas mixture was terminated. Furthermore, germane ($GeH_4$) gas was newly introduced to grow a crystal SiGe layer. At this time, the film was formed by setting a substrate temperature at 600° C., and setting a disilane partial pressure at 20 mPa and a germane partial pressure at 45 mPa. The film formation was performed for 7 minutes to obtain a crystal SiGe layer 13 (100 nm thick) containing Ge in a composition ratio of 20%. The obtained crystal SiGe layer 13 had strain. After the formation of the crystal SiGe layer 13 was completed, the supply of the germane gas was terminated. Subsequently, the crystal silicon layer was grown at a substrate temperature of 600° C. and at a disilane gas partial pressure of 8 mPa to form a crystal silicon layer 14 of 20 nm thick (FIG. 7B).

By the method explained in the above, the oxygen-containing crystal Si layer 12, the crystal SiGe layer 13, and crystal Si layer 14 (Si cap layer) are sequentially formed without exposing to air. At this step, the lattice of the crystal SiGe layer 13 is matched with that of the underling crystal Si layer 12 and has strain therein.

The laminated substrate thus formed is subjected to a thermal oxidation process performed in an oxidation furnace. Any thermal oxidation process may be used as long as it is generally used in steps of forming semiconductor devices. In this embodiment, the thermal oxidation was actually performed at 950° C. for 30 minutes. Through this step, oxygen atoms in the oxygen-containing Si layer 12 are condensed to form an amorphous silicon oxide layer formed of $SiO_2$ and SiO.

However, the amorphous silicon oxide layer is not always flattened by the thermal oxidation performed under the aforementioned conditions. The degree of the flatness is dependent upon the oxygen concentration and the thickness of the oxygen-containing crystal Si layer before the thermal oxidation process. However, it is difficult to improve the flatness of the amorphous silicon oxide layer under an oxygen concentration of 10% or less and a thermal treatment temperature of 1100° C. or less. Furthermore, if the Si concentration of the oxygen-containing crystal Si layer is low or if the thermal treatment temperature is low, the amorphous silicon oxide layer is sometimes condensed in a spherical form, preventing a continuous film formation.

Figure 7C:
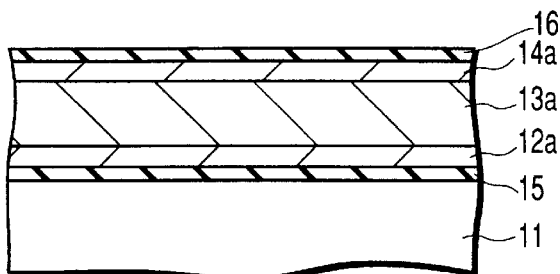

Through the thermal oxidation process mentioned above, a laminated structure consisting of an amorphous $SiO_x$ layer 15 (8 nm in average thickness), a crystal Si layer 12a containing oxygen in a small amount (16 nm), a crystal SiGe layer 13a (100 nm), a crystal Si layer 14a (10 nm), and a $SiO_2$ layer 16 (20 nm) is formed on the Si substrate 11 (FIG. 7C).

By the thermal processing, the lattice of the crystal SiGe layer 13a is relaxed and the lattice constant of the crystal SiGe layer 13a comes closer to that of normal SiGe (non-relaxed state). On the other hand, strain is imparted to the crystal Si layer 12a containing a small amount of oxygen and the upper crystal Si layer 14a. Note that the crystal Si layer obtained after the thermal process contains Ge (1% to several %) since Ge is diffused from the crystal SiGe layer.

Figure 7D:
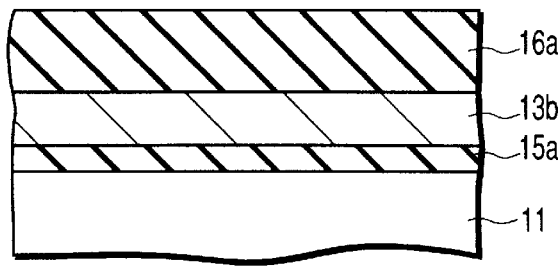

The substrate obtained after the thermal oxidation process is further subjected to annealing at a high temperature (second heating step) in an oxidizing atmosphere containing a high amount of oxygen. To be more specific, the second heating step is performed at a temperature of 1280° C. for 15 minutes by supplying a gas mixture of oxygen gas/argon gas in a concentration ratio of 1:1. Note that it is desirable that the ratio (partial pressure ratio) of the oxygen gas contained in the atmosphere be 10% or more. Through the thermal treatment, a silicon oxide layer 16a (120 nm thick) is formed. To be more specific, a laminated structure consisting of the SiO₂ layer (silicon oxide layer 15a, 15 nm thick), the crystal SiGe layer 13b (Ge content: 22%, 80 nm thick), and the SiO₂ layer (silicon oxide layer 16a, 120 nm thick) is formed on the Si substrate 11 (FIG. 7D).

It should be noted that not only the upper silicon oxide layer 16a but also the lower silicon oxide layer 15a is increased in thickness. This is interpreted as follows. Oxygen is supplied to the silicon oxide layer 15a through the crystal SiGe layer 13a from the surface side, thereby accelerating the growth of the silicon oxide layer 15a. Furthermore, the silicon oxide layers 15a and 16a are increased in thickness, whereas the crystal SiGe layer 13b is reduced in thickness. In addition, Ge atoms rarely remain in the silicon oxide layers 15a and 16a. As a result, the Ge concentration of the crystal SiGe layer 13b increases.

Furthermore, it has been confirmed that the silicon oxide film 15 which was poor in flatness after the first thermal treatment, was flattened by the second high-temperature heating step. More specifically, the silicon oxide layer 15 formed in a spherical oxide form or in a discontinuous state is converted into an extremely flatten silicon oxide layer 15a by the second high-temperature thermal treatment.

If the silicon oxide layers 15a and 16a are further increased in thickness by extending the time for the second high-temperature thermal treatment, it is possible to further reduce the thickness of the crystal SiGe layer and increase a Ge concentration of the crystal SiGe layer. However, if Ge is contained in a high amount, the SiGe layer is degraded during high-temperature treatment process in some cases. In other cases, Ge is segregated and melted out, or bumping takes place by an increase in vapor pressure. To avoid such a problem, it is useful to reduce the heating temperature. In the case where the Ge composition ratio exceeds 25%, the heating temperature is desirably set at 1250° C. or less. In the case where the Ge composition ratio exceeds 30%, the heating temperature is desirably set at 1230° C. Furthermore, since the SiGe layer is reduced in thickness and increased in Ge content in the middle of the thermal treatment, the heating temperature may be gradually reduced.

After the second thermal treatment, if a third high-temperature thermal treatment is performed by reducing a composition ratio of oxygen gas, it is possible to increase the crystal quality of the crystal SiGe layer. At the time the second thermal treatment is completed, the crystal SiGe layer is almost completely relaxed. However, if the time for the second thermal treatment is short, the quality of crystal is sometimes insufficient. The third thermal treatment is performed for about 4 hours in an Ar gas atmosphere containing an oxygen gas in an amount of 1% or less, preferably 0.2 to 0.8%, and more preferably 0.5%. Through the thermal treatment, it is possible to improve the crystal quality of the SiGe layer.

The most important one of the three thermal treatment steps is a second one. The first thermal treatment may be omitted. If the second thermal treatment is performed by reducing the ratio of the oxygen gas to decrease an oxidation speed and by increasing the heating time, it is possible to shorten the time required for the third thermal treatment or to omit the step.

The three thermal treatments shown in this embodiment can be applied to other structure besides the laminated structure having the oxygen-containing crystal Si layer. For example, if the thermal treatment is applied to the crystal SiGe layer and the crystal Si layer which are epitaxially grown on the SOI substrate manufactured by a general method, it is possible to form a relaxed crystal SiGe layer high in Ge concentration, directly on the silicon oxide layer.

Figure 8B:
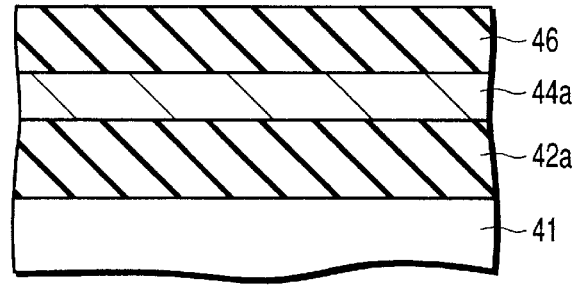
FIGS. 8A and 8B are schematic sectional views of a semiconductor device formed by another manufacturing method according to Embodiment 4 of the present invention.
Figure 8A:
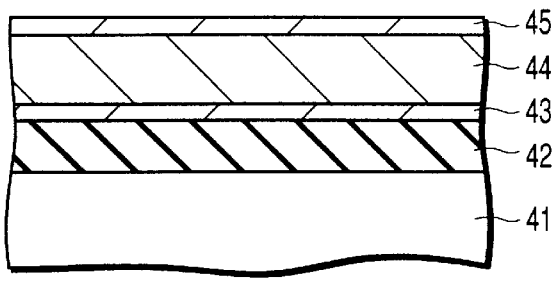

This will be more specifically explained with reference to FIGS. 8A and 8B.

First, an SOI substrate is prepared by forming a silicon oxide layer 42 and a crystal Si layer 43 (10 nm thick) on a silicon substrate 41. Furthermore, a crystal SiGe layer 44 (100 nm thick) containing Ge in a composition ratio of 10% on the SOI substrate and further a crystal Si layer 45 (15 nm thick) is formed on the crystal SiGe layer 44. At this step, the lattice of the crystal SiGe layer 44 is matched with that of the crystal Si layer 43. The crystal SiGe layer has strain (FIG. 8A).

Next, the first to third thermal treatments mentioned above are performed. The silicon oxide layer is formed at a surface side by the first thermal treatment. Thereafter, the upper silicon oxide layer 46 and the inner silicon oxide layer 42a (buried oxide film) increase in thickness by the second high temperature thermal treatment performed in an oxidizing atmosphere. At this time, Ge atoms are diffused in a crystal region sandwiched by the silicon oxide layers 46 and 42a. The Ge atoms are also diffused in the crystalline silicon layers 43 and 45, so that a crystal SiGe layer 44a uniform in composition is formed. The crystal SiGe layer 44a is relaxed by the second high-temperature thermal treatment. In the second high-temperature thermal treatment, if the heating is performed at a temperature of 1050° C. or more for one hour or more, the Ge atoms are sufficiently diffused into the crystal Si layer. Thereafter, the third thermal treatment is performed to thereby obtain a crystal in high-quality (FIG. 8B).

The three thermal treatment shown in this embodiment is applicable to a SIMOX process. This process will be explained more specifically with reference to FIGS. 9A and 9B.

Figure 9A:
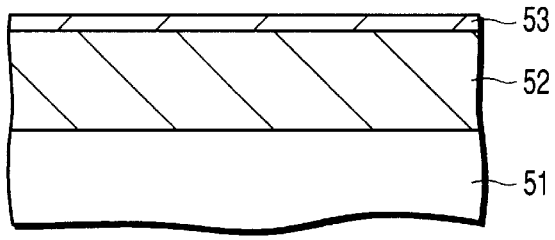
FIGS. 9A and 9B are schematic sectional views of a semiconductor device formed by still another method according to Embodiment 4 of the present invention.

A crystal SiGe layer 52 (Ge composition ratio: 15%) is formed on a silicon substrate 51 in a thickness of 1 μm or more. Then, a crystal Si layer 53 (Si cap layer of 20 nm thick) is formed on the crystal SiGe layer 52 (FIG. 9A).

Figure 9B:
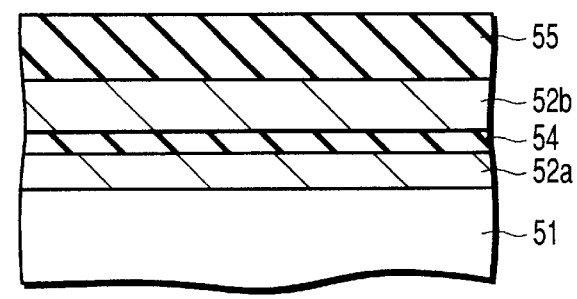

Subsequently, oxygen ions are implanted into the crystal SiGe layer 52. Thereafter, the first to third thermal treatments (it is sufficient if at least second and third thermal treatments are performed) are performed. Through the thermal treatment, a silicon oxide layer 54 is formed between the crystal SiGe layers 52a and 52b. The silicon oxide layer 55 is formed on the crystal SiGe layer 52b. The crystal SiGe layer 52b relaxed is obtained on the silicon oxide film 54 (FIG. 9B).

The aforementioned steps are described more specifically below. First, oxygen ions are implanted in an amount of 4×10¹⁷ atoms/cm² at an acceleration voltage of 160 keV into the crystal SiGe layer formed on the Si substrate 51. After the first thermal treatment is performed, the second thermal treatment is performed in an oxidizing atmosphere containing a large amount of oxygen. By the heat treatment, the silicon oxide layer 54 (buried oxide film) is formed and simultaneously the upper silicon oxide layer 55 increases in thickness. In addition, the Ge concentration of the crystal SiGe layer 52b in the region sandwiched between the silicon oxide layers 54 and 55 increases and the crystal SiGe layer 52b reduced in thickness.

In the case of the SIMOX process, the region doped with oxygen ions is not obtained as a completely vitreous silicon oxide layer. Therefore, the region doped with oxygen ions is not used as a barrier for preventing the diffusion of Ge atoms. Therefore, although the SiGe layer is slightly thicker than that of the region doped with oxygen ions, this difference in thickness is not enough to prevent diffusion of Ge ions. Ge ions are diffused in the beginning of the high temperature thermal treatment step, with the result that the Ge concentration of the SiGe layer decreases. Therefore, to prevent the decrease in Ge concentration, it is necessary to increase the thickness of the SiGe layer sufficiently larger than that of the region doped with oxygen ions.

In this embodiment, the SiGe layer sandwiched by the silicon oxide layers (or Si layer containing oxygen in a large amount) is subjected to the high temperature thermal treatment in the oxidizing atmosphere containing a large amount of oxygen gas. The surface region is oxidized by the high-temperature thermal treatment in an oxidizing atmosphere, and simultaneously, the oxygen atoms are transported inside the crystal layer. It follows that a buried oxide film is grown, leading to a flat and good-quality buried amorphous oxide film. Ge atoms are not taken into both silicon oxide layers. The vitreous silicon oxide layer functions as a barrier for suppressing the diffusion of the Ge atoms. As a result, the SiGe layer sandwiched by both silicon oxide layers reduces in thickness and increases in Ge concentration.

It has been hitherto reported that oxygen ions are implanted directly into the SiGe layer to form a relaxed SiGe layer on the buried oxide film by the SIMOX process. However, it is difficult to set heating conditions for the SiGe layer containing a large amount of Ge, and therefore, it is not easy to form a SiGe-OI (SiGe On Insulator) in a good quality. According to the method of this embodiment, the Ge concentration is increased by the second high-temperature thermal treatment even if the SiGe layer contains Ge in a low amount. It is therefore possible to obtain the SiGe layer high in Ge concentration.

The second high-temperature thermal treatment may be performed in an atmosphere containing water vapor ($H_2O$) in a large amount other than the oxygen gas atmosphere.

This embodiment has been explained mainly with respect to a method of forming the SiGe layer having a thickness of as thin as 100 nm or less and containing Ge in a composition ratio of larger than 15%. However, the following process may be employed. The surface oxide film formed in the second high-temperature thermal treatment is removed by hydrofluoric acid (HF) or an ammonium fluoride solution to expose the SiGe layer. A Si layer is allowed to grow on the SiGe layer exposed, in a thickness of about 50 nm or less, thereby forming a laminated structure consisting of a Si layer having strain and the SiGe layer relaxed on an insulator.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:.
    a first crystal silicon layer doped with oxygen and formed on a single crystal silicon substrate;
    a crystal silicon-germanium layer formed on the first crystal silicon layer; and
    a second crystal silicon layer having strain and formed on the crystal silicon-germanium layer.

2. The semiconductor device according to claim 1, wherein an oxygen concentration of the first crystal silicon layer is 1% or more and 20% or less.

3. The semiconductor device according to claim 1, wherein an oxygen concentration of the first crystal silicon layer is 1% or more and 15% or less.

4. A semiconductor device comprising:
    a first crystal silicon layer formed on a single crystal silicon substrate, the first crystal silicon layer having a structure in which first crystal silicon regions doped with oxygen sandwich a second crystal silicon region doped with an N-type or P-type impurity;
    a crystal silicon-germanium layer formed on the first crystal silicon layer; and
    a second crystal silicon layer having strain and formed on the crystal silicon-germanium layer.

5. The semiconductor device according to claim 4, wherein an oxygen concentration of the first crystal silicon regions is 1% or more and 20% or less.

6. The semiconductor device according to claim 4, wherein an oxygen concentration of the first crystal silicon regions is 1% or more and 15% or less.

7. A semiconductor device comprising:
    a first crystal silicon layer doped with oxygen and formed on a single crystal silicon substrate;
    a laminated silicon layer formed on the first crystal silicon layer, the laminated silicon layer having a structure in which first crystal silicon regions doped with oxygen and second crystal silicon regions undoped with oxygen are alternately stacked;
    a crystal silicon-germanium layer formed on the laminated silicon layer; and
    a second crystal silicon layer having strain and formed on the crystal silicon-germanium layer.

8. The semiconductor device according to claim 2, wherein at least one of the second crystal silicon regions is doped with an N-type or P-type impurity.

9. The semiconductor device according to claim 2, wherein at least one of the second crystal silicon regions is doped with germanium.

10. The semiconductor device according to claim 7, wherein an oxygen concentration of the first crystal silicon layer is 1% or more and 20% or less.

11. The semiconductor device according to claim 7, wherein an oxygen concentration of the first crystal silicon layer is 1% or more and 15% or less.

12. The semiconductor device according to claim 7, wherein the second crystal silicon regions are doped with germanium, and a germanium concentration of said second crystal silicon regions gradually increases toward an upper second crystal silicon region from a lower second crystal silicon region.

* * * * *

UNITED STATES PATENT AND TRADEMARK OFFICE
CERTIFICATE OF CORRECTION

PATENT NO.    : 6,369,438 B1                                        Page 1 of 1
DATED         : April 9, 2002
INVENTOR(S)   : Sugiyama et al.

It is certified that error appears in the above-identified patent and that said Letters Patent is hereby corrected as shown below:

Column 13,
Line 60, change "comprising:." to -- comprising: --.

Column 14,
Lines 43 and 46, change "claim 2" to -- claim 7 --.

Signed and Sealed this

Twenty-second Day of July, 2003

JAMES E. ROGAN
*Director of the United States Patent and Trademark Office*